(12) United States Patent
Shimura et al.

(10) Patent No.: US 6,807,063 B2
(45) Date of Patent: Oct. 19, 2004

(54) HIGH-FREQUENCY INTEGRATED CIRCUIT MODULE

(75) Inventors: Toshihiro Shimura, Kawasaki (JP); Yoji Ohashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 158 days.

(21) Appl. No.: 10/277,485

(22) Filed: Oct. 22, 2002

(65) Prior Publication Data

US 2003/0174479 A1 Sep. 18, 2003

(30) Foreign Application Priority Data

Mar. 14, 2002 (JP) ........................................ 2002-070370

(51) Int. Cl.$^7$ ................................................. H05K 1/18
(52) U.S. Cl. ........................ 361/764; 361/784; 257/728
(58) Field of Search ................................ 361/760–764, 361/784, 792–794, 816, 818; 174/35 MS, 51, 259–261; 257/723–724, 728

(56) References Cited

U.S. PATENT DOCUMENTS

| | | | | |
|---|---|---|---|---|
| 5,375,042 A | * | 12/1994 | Arima et al. | ............... 361/784 |
| 5,639,989 A | * | 6/1997 | Higgins, III | ........... 174/35 MS |
| 6,057,600 A | * | 5/2000 | Kitazawa et al. | ........... 257/728 |
| 6,384,701 B1 | * | 5/2002 | Yamada et al. | ............. 333/247 |

FOREIGN PATENT DOCUMENTS

| | | |
|---|---|---|
| JP | 8-139504 | 5/1996 |
| JP | 10-303333 | 11/1998 |
| JP | 2001-36309 | 2/2001 |

* cited by examiner

Primary Examiner—Luan Thai
Assistant Examiner—Tuan Dinh
(74) Attorney, Agent, or Firm—Katten Muchin Zavis Rosenman

(57) ABSTRACT

A high-frequency integrated circuit (IC) module comprising a multilayer mounting board on which an integrated circuit with a plurality of high-frequency signal terminals is mounted, and IC connecting portions disposed on one surface of the multilayer mounting board and respectively connected with the high-frequency signal terminals. The high-frequency IC module further comprises external connection terminal portions disposed at wider intervals than those between the high-frequency signal terminals, high-frequency signal lines provided within the multilayer mounting board, first through holes for connecting the inner ends of the high-frequency signal lines with the IC connecting portions, and second through holes for connecting the outer ends of the high-frequency signal lines with the external connection terminal portions. At least between the high-frequency signal lines, a high-frequency restricting member for ground-connecting both surfaces of the multilayer mounting board and restricting propagation of high-frequency signals is provided along the high-frequency signal lines.

16 Claims, 22 Drawing Sheets

HIGH-FREQUENCY INTEGRATED CIRCUIT MODULE

BACKGROUND OF THE INVENTION (1) Field of the Invention

The present invention relates to a high-frequency integrated circuit module for mounting an integrated circuit (IC) which operates with high-frequency waves in a high frequency band such as a microwave band and a milliwave band.

(2) Description of the Related Art

Because of the multifunction of an IC chip which operates in a microwave band or milliwave band, one IC chip requires three or more radio frequency (RF) signal terminals. Within an IC chip, the width of RF signal terminals is narrow and therefore isolation between the RF signal terminals is assured.

In general, the thickness of a circuit board is selected so that the width of lines in a package for mounting an IC chip becomes greater than that of terminals in the IC chip in consideration of signal line connections which are made for secondary mounting. At the same time, transmission and reflection characteristics are assured. FIG. 19 shows a plan view of a prior art high-frequency IC module.

The high-frequency IC module 100 shown in FIG. 19 includes, for example, an IC chip 100; a metal plate (metal board) 101; a first ceramic plate (ceramic board) 102a molded integrally with the metal plate 101 and constituting a feed line portion for a RF signal on one side of the metal plate 101; and a second ceramic plate 102b molded integrally with the metal plate 101 and constituting a feed line portion for RF signals on the other side of the metal plate 101.

The first ceramic plate 102a is provided with a microstrip transmission line 103, which is connected with the RF signal terminal 111 of an IC chip 110 through a bonding wire. The second ceramic plate 102b is provided with three microstrip transmission lines 104, 105, and 106, which are connected with the RF signal terminals 112, 113, and 114 of the IC chip 110 through bonding wires. Note in FIG. 19 that reference numeral 107 denotes a position at which a cap for hermetically sealing the IC chip 110 is mounted.

The above-described IC chip 110 with a plurality of RF signal terminals 112, 113, and 114 on one side has, for example, the function of selecting one system from RF signals received from a plurality of systems. Such an IC chip can be applied to a high-frequency receiving circuit which employs an adaptive array antenna.

However, if the IC chip 110 is mounted on the above-described package having a plurality of microstrip transmission lines 104, 105, and 106 on one side thereof, isolation between the RF signal terminals will be degraded compared with the characteristics of the IC chip 110, because the width of the microstrip transmission lines 104, 105, and 106 on the package side is greater than that of the RF signal terminals of the IC chip 110.

That is, coupling occurs over the length of each of the microstrip transmission lines 104, 105, and 106, and resonance occurs at a frequency resulting from the line length. Because of this, the transmission characteristics degrade sharply.

FIG. 20 shows a layout in the case where an electromagnetic simulation of microstrip transmission lines close to each other is made. The transmission characteristics obtained by the simulation are shown in FIGS. 21A and 21B. In the simulation, a ceramic board was employed and microstrip transmission lines of 0.2 mm in thickness were assumed to be arranged at the interval of 1 mm. FIG. 21A shows a reflection characteristic in the case where a RF signal (for example, 30 GHz or greater) is input to an input port "1" shown in FIG. 20. FIG. 21B shows a through characteristic in the case where the RF signal is input to the input port 1.

In this case, the interval between the microstrip transmission lines is narrow and therefore coupling takes place over the length of the line. As shown at reference numerals 121 to 128 in FIGS. 21A and 21B, resonance takes place at specific frequencies resulting from line length and there is a sharp degradation of transmission characteristics (reflection and through characteristics) (i.e., isolation degradation).

On the other hand, if the interval between the microstrip lines is increased to 1.5 mm and 3.0 mm, as shown in FIGS. 22A, 22B, 23A, and 23B, resonance resulting from line length is less likely to occur and that there is no isolation degradation. Note that the transmission characteristics in the case of interval=1.5 mm are shown in FIGS. 22A and 22B. The transmission characteristics in the case of interval=3.0 mm are shown in FIGS. 23A and 23B.

Thus, it is necessary that microstrip transmission lines for secondary mounting be spaced to some degree. However, since the spaces between the RF signal terminals 112, 113, and 114 of the IC chip 110 are narrow, the line space in a portion of the IC chip 110 becomes narrow. Because of this, the case of a RF signal of about a few GHz is considered practically negligible. However, in the case of a RF signal having an extremely high frequency of 30 GHz or greater, isolation degradation at the line-space narrowed portion is not negligible.

Particularly, in the case of a high frequency of 30 GHz or greater, the wavelength becomes about a few millimeters and performance depends on the size of a component such as an IC chip and a package. Therefore, when obtaining a high gain by a high-frequency flip-chip structure, there are cases where the operation of a circuit becomes unstable by the leakage of unnecessary high-frequency components.

SUMMARY OF THE INVENTION

The present invention has been made in view of the circumstances mentioned above. Accordingly, it is the primary object of the present invention to provide a high-frequency IC module which is capable of minimizing the leakage of unnecessary high-frequency components and assuring the required isolation between a plurality of high-frequency signal terminals disposed on one side portion of an IC chip, even when mounting an IC which processes high-frequency signals in an extremely high frequency band such as a microwave band and a milliwave band.

To achieve this end and in accordance with the present invention, there is provided a high-frequency integrated circuit (IC) module comprising:

(1) a multilayer mounting board on which an IC with a plurality of high-frequency signal terminals on one side portion thereof is mounted;

(2) a plurality of IC connecting portions disposed on one surface of the multilayer mounting board on which the IC is mounted, the IC connecting portions being respectively connected with the plurality of high-frequency signal terminals of the IC;

(3) a plurality of external connection terminal portions disposed on a side portion of the other surface of the multilayer mounting board which portion corresponds to the one side portion of the IC, at wider intervals than those between the high-frequency signal terminals of the IC;

(4) a plurality of high-frequency signal lines provided within the multilayer mounting board to transmit high-frequency signals;

(5) a plurality of first through holes for respectively connecting the inner ends of the high-frequency signal lines with the IC connecting portions;

(6) a plurality of second through holes for respectively connecting the outer ends of the high-frequency signal lines with the external connection terminal portions; and (7) a high-frequency restricting member for ground-connecting both surfaces of the multilayer mounting board and restricting propagation of high-frequency signals, provided at least between the high-frequency signal lines and along the high-frequency signal lines.

In the high-frequency IC module of the present invention constructed as described above, between a plurality of high-frequency signal terminals provided on one surface of the multilayer mounting board and a plurality of external connection terminal portions provided on the other surface of the multilayer mounting board, high-frequency signals are transmitted within the multilayer mounting board through the above-described through holes and high-frequency signal lines.

In the high-frequency IC module of the present invention, the external connection terminal portions within the multilayer mounting board are disposed at wider intervals than those between the high-frequency signal terminals of the IC. Furthermore, between the high-frequency signal lines, the above-described high-frequency restricting member is provided along the high-frequency signal lines. Therefore, the high-frequency IC module of the present invention is capable of preventing unnecessary line coupling due to the propagation of the leakage components of high-frequency signals within the multilayer mounting board and also preventing a resonance phenomenon due to the occurrence of an unnecessary propagation mode.

Therefore, even in the case where an integrated circuit has a plurality of high-frequency signal terminals (for high-frequency signals in a microwave band or milliwave band) on one side portion thereof, the required isolation between signal terminals can be easily assured.

In the high-frequency IC module of the present invention, the above-described high-frequency restricting member may comprise a plurality of third through holes for ground-connecting both surfaces of the multilayer mounting board. The third through holes are provided within the multilayer mounting board and at least between the high-frequency signal lines and along the high-frequency signal lines. In this manner, the above-described line coupling and resonance phenomenon can be relatively easily prevented by employing the existing through-hole processing technique. Therefore, the manufacturing cost can be reduced.

In the high-frequency IC module of the present invention, the above-described IC connecting portions may comprise coplanar lines, respectively. The above-described external connection terminal portions may also comprise coplanar lines, respectively. In this case, the signal-line exposed portion can be minimized at both surfaces of the multilayer mounting board. Therefore, when the IC is molded with predetermined resins, the influence of resins on signal lines can be minimized and isolation degradation can be minimized.

Further in accordance with the present invention, there is provided a high-frequency integrated circuit (IC) module comprising:

(1) a primary multilayer mounting board on which an IC with a plurality of high-frequency signal terminals on one side portion thereof is mounted;

(2) a plurality of IC connecting portions disposed on one surface of the primary multilayer mounting board on which the IC is mounted, the IC connecting portions being respectively connected with the plurality of high-frequency signal terminals of the IC;

(3) a plurality of external connection terminal portions disposed on a side portion of the other surface of the primary multilayer mounting board which potion corresponds to the one side portion of the IC, at wider intervals than those between the high-frequency signal terminals of the IC;

(4) a plurality of high-frequency signal lines provided on the other surface of the primary multilayer mounting board and respectively connected at their outer ends with the external connection terminal portions;

(5) a plurality of first through holes for respectively connecting the inner ends of the high-frequency signal lines with the IC connecting portions;

(6) a secondary multilayer mounting board connected with the other surface of the primary multilayer mounting board through bumps; and (7) a high-frequency restricting member, for ground-connecting positions between the high-frequency signal lines with the one surface of the primary multilayer mounting board and restricting propagation of high-frequency signals, provided at least along the high-frequency signal lines.

In the high-frequency IC module of the present invention constructed as described above, between a plurality of high-frequency signal terminals provided on one surface of the multilayer mounting board and a plurality of external connection terminal portions provided on the other surface of the multilayer mounting board, high-frequency signals are transmitted at the other surface of the multilayer mounting board through the above-described through holes and high-frequency signal lines.

In the high-frequency IC module of the present invention, the high-frequency signal lines are connected to the external connection terminal portions disposed at wider intervals than those of the high-frequency signal lines. The high-frequency restricting member, for ground-connecting positions between the high-frequency signal lines with the one surface of the primary multilayer mounting board and restricting propagation of high-frequency signals, is provided at least along the high-frequency signal lines. Furthermore, the high-frequency signal lines can be positioned within a closed space by a connection with a secondary multilayer mounting board. Therefore, compared with the case where high-frequency signal lines are provided within a primary multilayer mounting board, the above-described line coupling and resonance phenomenon can be prevented with a simpler structure.

Even in the case where high-frequency signal lines are provided on the bottom surface of the multilayer mounting board, the high-frequency signal lines can be positioned within a closed space by a connection with a secondary multilayer mounting board. Therefore, compared with the case where high-frequency signal lines are provided within a primary multilayer mounting board, the above-described line coupling and resonance phenomenon can be prevented with a simpler structure.

In the case where high-frequency signal lines are provided on the bottom surface of the multilayer mounting board, the outer ends of the high-frequency signal lines are formed as the external connection terminals, respectively. Therefore, compared with the case where the high-frequency signal lines are formed separately from the external connection terminals, signal transmission reliability can be enhanced and the number of manufacturing steps and the manufacturing cost can be reduced.

BRIEF DESCRIPTION OF THE DRAWINGS

The present invention will be described in further detail with reference to the accompanying drawings wherein.

DESCRIPTION OF THE PREFERRED EMBODIMENTS

Embodiments of the present invention will hereinafter be described with reference to the drawings.

(A) First Embodiment

Figure 1:
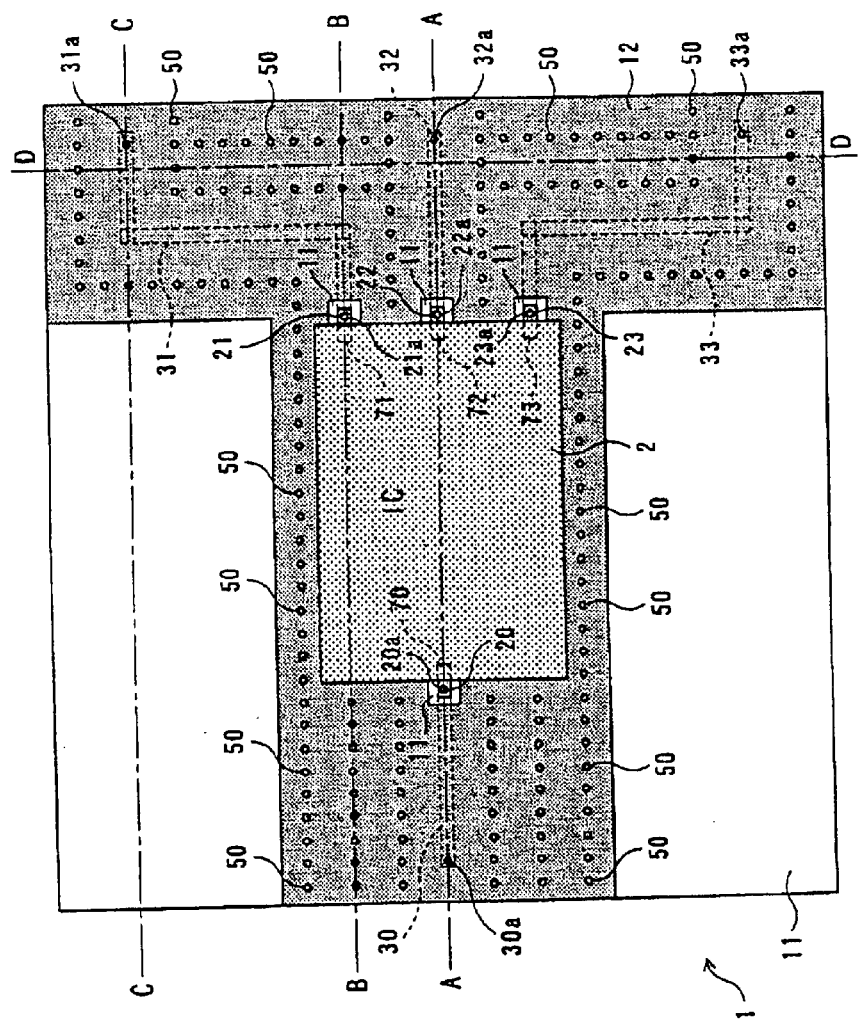
FIG. 1 is a plan view schematically showing a high-frequency IC module constructed in accordance with a first embodiment of the present invention.
Figure 2:
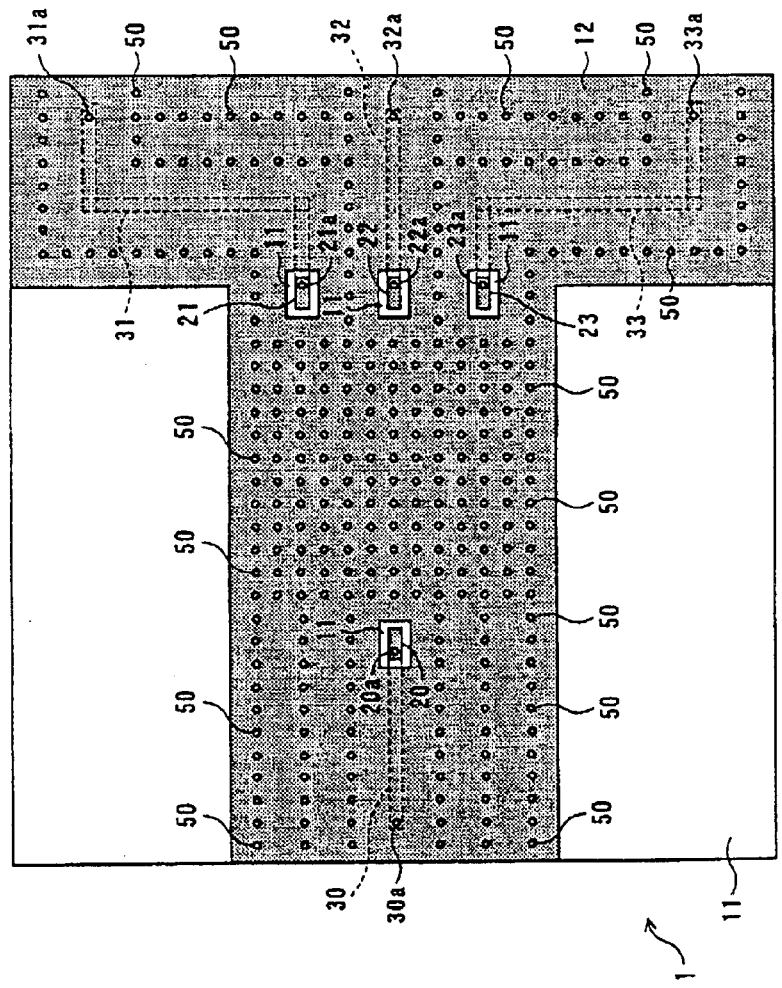
FIG. 2 is a plan view of the primary multilayer mounting board on which an IC chip is not mounted in FIG. 1.
Figure 3:
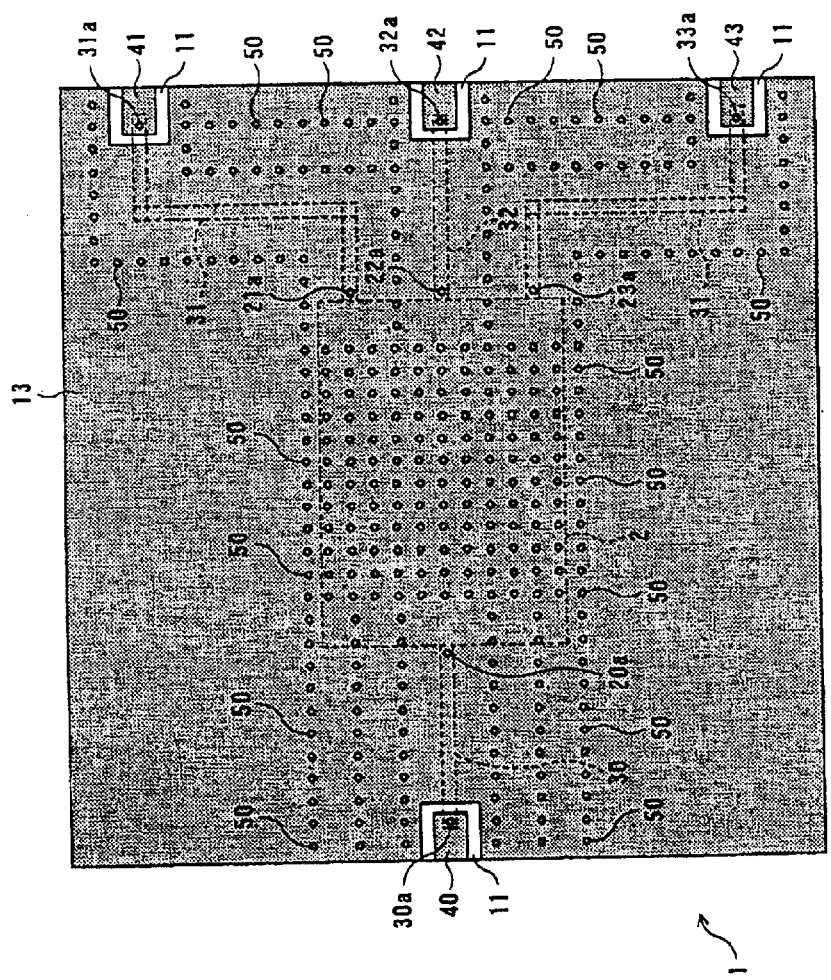
FIG. 3 is a plan view schematically showing the bottom surface of the primary multilayer mounting board shown in FIGS. 1 and 2.

FIG. 1 shows a plan view schematically showing a high-frequency IC module constructed in accordance with a first embodiment of the present invention. In the figure, reference numeral 1 denotes a primary multilayer mounting board (also referred to simply as a "mounting board"), and reference numeral 2 denotes an IC chip mounted on this primary multilayer mounting board 1. FIG. 2 is a plan view schematically showing the primary multilayer mounting board 1 on which the IC chip 2 is not mounted in FIG. 1, and FIG. 3 is a plan view schematically showing the bottom surface (opposite from the surface on which the IC chip 2 is mounted) of the primary multilayer mounting board 1 shown in FIGS. 1 and 2.

Figure 4:
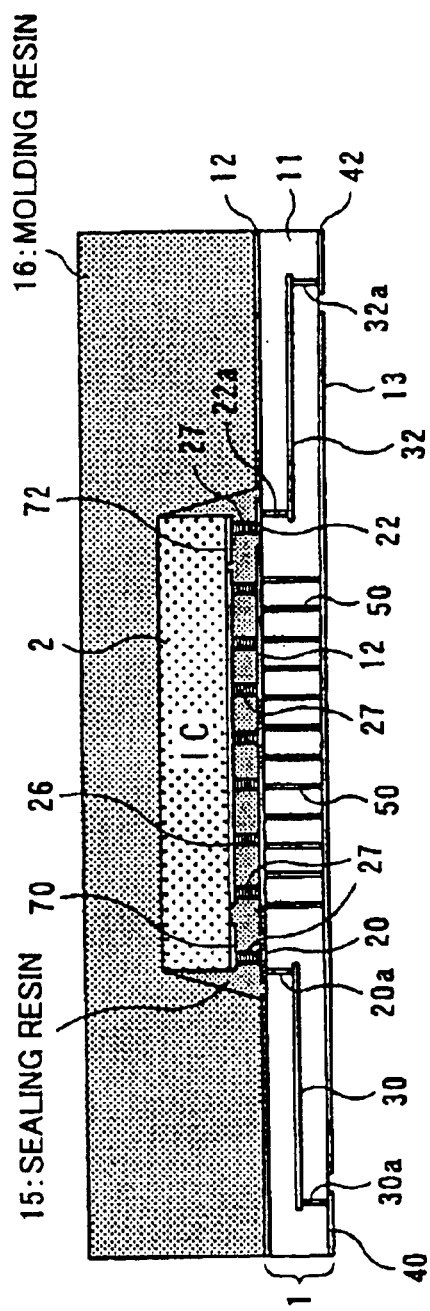
FIG. 4 is a sectional view of the primary multilayer mounting board taken along line A—A of FIG. 1.
Figure 5:
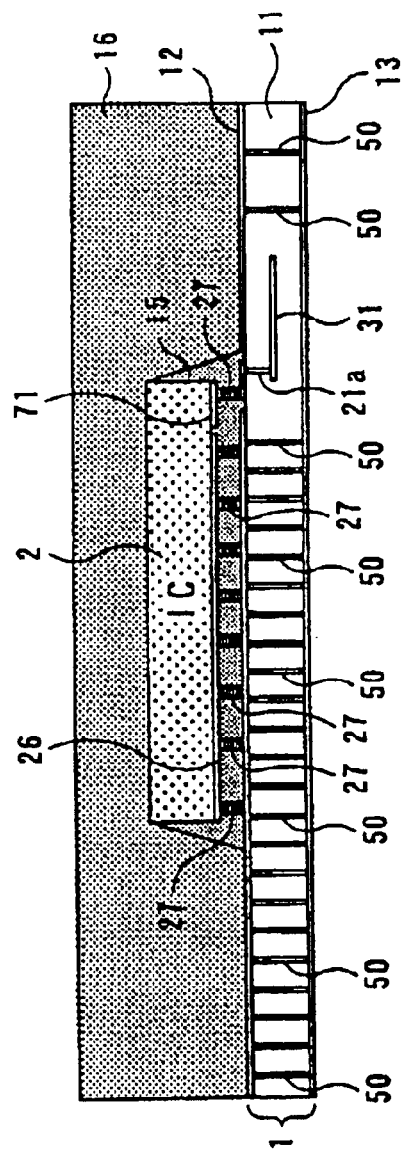
FIG. 5 is a sectional view of the primary multilayer mounting board taken along line B—B of FIG. 1.
Figure 6:
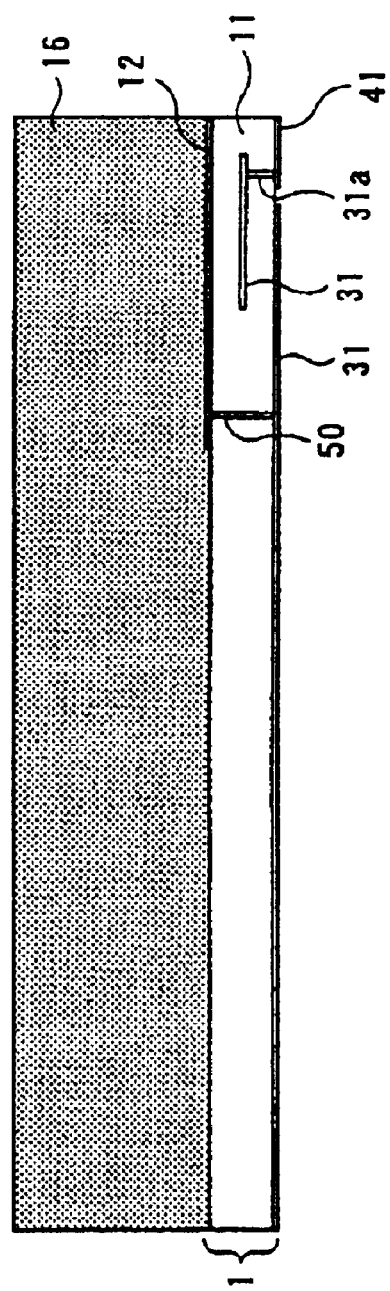
FIG. 6 is a sectional view of the primary multilayer mounting board taken along line C—C of FIG. 1.
Figure 7:
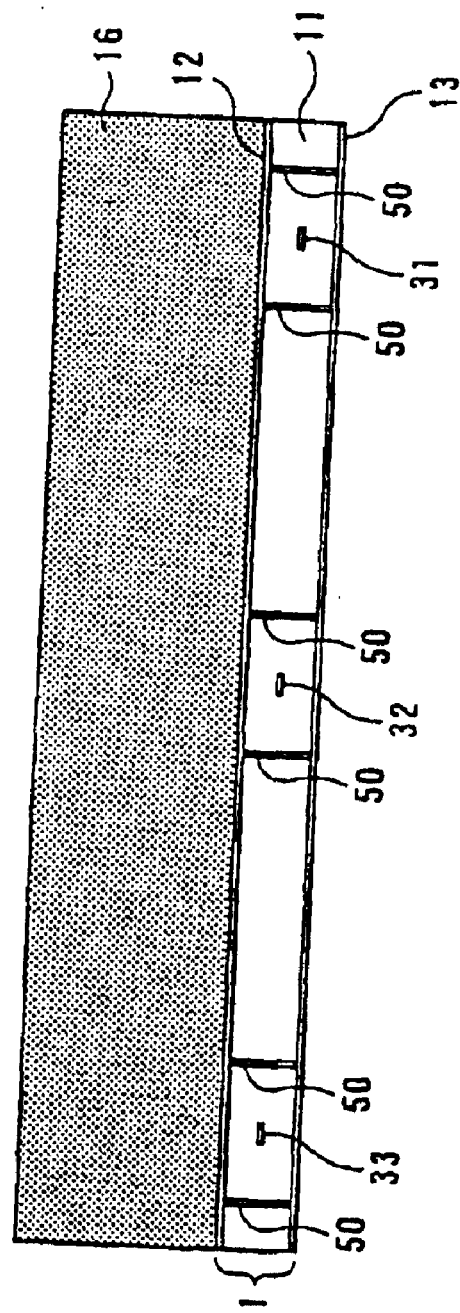
FIG. 7 is a sectional view of the primary multilayer mounting board taken along line D—D of FIG. 1.

FIG. 4 shows a sectional view of the mounting board 1 taken along line A—A of FIG. 1, FIG. 5 a sectional view of the mounting board 1 taken along line B—B of FIG. 1, FIG. 6 a sectional view of the mounting board 1 taken along line C—C of FIG. 1, and FIG. 7 a sectional view of the mounting board 1 taken along line D—D of FIG. 1. However, the sectional views shown in FIGS. 4 to 7 represent the state where, in FIG. 1, sealing resin 15 is injected between the flip-chip mounted IC chip 2 and the mounting board 1, and furthermore, the entire surface of the mounting board 1 is covered with molding resin 16.

The mounting board 1, as shown FIGS. 1 and 4, has a dielectric board 11 such as a ceramic board, etc. One surface (IC-chip mounting surface) of this dielectric board 11, as shown in FIG. 1, is provided with a coplanar line 20 which is connected with one electrode (RF signal terminal) 70 provided on the left side portion of the IC chip 2; coplanar lines (IC connecting portions) 21, 22, 23 which are respectively connected with a plurality (three) of electrodes (RF signal terminals) provided on the right side portion of the IC chip 2; and an upper metal plate or ground metal plate (shaded portion) 12 partially covering the IC-chip mounting surface of the dielectric board 11 while avoiding these coplanar lines 20 to 23.

Thus, by employing the coplanar lines 20, 21, 22, and 23, which is narrow in width and short in length, in the connection portion between the mounting board 1 and the IC chip 2, isolation degradation between them can be suppressed even in the case where the connection portions with the RF signal terminals 71, 72, and 73 are provided on the same end portion of the IC chip 2. Therefore, in the case of handling high-frequency signals in a milliwave band or microwave band, flip-chip mounting of the IC chip 2 becomes possible.

The "flip-chip mounting," as is generally known, is a kind of method for mounting ICs. As shown in FIGS. 4 and 5, it is a mounting method by which the metal plate (ground metal plate) 26 of the reversed IC chip 2 is connected directly with the mounting board 1 (upper ground metal plate 12) through connecting metal bumps 27. This "flip-chip mounting" has the advantage that it can reduce the influence of parasitic inductance, etc., because it can shorten connection length considerably, compared with wiring bonding.

As shown in FIG. 3, the bottom surface (opposite from the IC-chip mounting surface) of the dielectric board 11 is provided with coplanar lines 40, 41, 42, and 43 constituting external connection terminals and also provided with a metal plate (lower ground metal plate) 13 covering the entire bottom surface (opposite from the IC-chip mounting surface) of the dielectric board 11 while avoiding these coplanar lines 40 to 43.

The upper ground metal plate 12 and lower ground metal plate 13 are formed on the top surface and bottom surface of the dielectric board 11 by vapor deposition or plating, respectively. As shown in FIG. 3, the coplanar lines (external connection terminals) 41, 42, and 43 on the same end portion of the mounting board 1 are disposed at wider intervals than those of the coplanar lines 21, 22, and 23 (RF signal terminals 71, 72, and 73 provided on the same end portion of the IC chip 2) on the IC-chip mounting surface, in order to assure isolation between terminals.

As shown in FIGS. 1, 3, and 4, within the dielectric board 11, four strip lines (high-frequency signal lines) 30, 31, 32, and 33 are provided to correspond to the coplanar lines 20, 21, 22, and 23 of the IC-chip mounting surface (RF signal terminals 70, 71, 72, and 73). The strip lines 30, 31, 32, and 33 are connected at their inner ends with the corresponding coplanar lines 20, 21, 22, and 23 via through holes 20a, 21a, 22a, and 23a, and are also connected at their outer ends with the coplanar lines 40, 41, 42, and 43 of the bottom surface of the dielectric board 11 via through holes 30a, 31a, 32a, and 33a.

As previously stated, the coplanar lines 41, 42, and 43 are disposed at wider intervals than those of the coplanar lines 21, 22, and 23. Therefore, in this embodiment, the strip lines 31 and 33 are disposed in crank form within the dielectric board 11 so that the interval therebetween becomes wider as they go away from the IC chip 2. Of course, the strip lines 31 and 33 may also be disposed in straight-line form or curved-line form.

With the above-described connections, the RF signal terminals 70, 71, 72, and 73 of the IC chip 2 (coplanar lines 20, 21, 22, and 23) are electrically connected with the corresponding external connection terminals 40, 41, 42, and 43 on the bottom surface of the mounting board 1 through the strip lines 30, 31, 32, and 33 provided within the dielectric board 11. Therefore, signal lines are taken out on the bottom surface of the mounting board 1 (see FIG. 4).

Thus, by employing the strip lines 40, 41, 42, and 43, through holes 20a, 21a, 22a, and 23a, and through holes 30a, 31a, 32a, and 33a, the bottom surface of the mounting board 1 is utilized as a surface to which signal lines are taken out, and the external connection terminals of the bottom surface are used as the coplanar lines 40, 41, 42, and 43. In this manner, a surface mounting type module can be formed with respect to a secondary mounting board. Note that the surface mounting with respect to the secondary mounting board is to be described later.

As shown in FIGS. 1 through 7, in addition to the above-described through holes 20a, 21a, 22a, 23a and through holes 30a, 31a, 32a, 33a connected with the strip lines 30, 31, 32, and 33, the mounting board 1 of this embodiment is provided with a plurality of through holes 50 through which the upper ground metal plate 12 is connected (ground-connected) with the lower ground metal plate 13.

These through holes 50, as shown in FIGS. 1 to 3, are basically provided along the strip lines 30, 31, 32, and 33 so as to surround the strip lines 30, 31, 32, and 33. This arrangement can prevent a bad influence due to the propagation of unnecessary leakage components of a high-frequency signal (in a microwave band or milliwave band) that is transferred to the strip lines 30, 31, 32, and 33. That is, these through holes 50 serve as a high-frequency restricting member.

Particularly, in this embodiment, the through holes 50 are arranged along the strip lines 31, 32, and 33 and between the microstrip transmission lines 31, 32, and 33. Therefore, coupling of unnecessary leakage components is prevented between the adjacent portions of the strip lines 31, 32, and 33 provided on the same end portion of the mounting board 1 (i.e., between the RF signal terminals 71, 72, and 73 provided in close proximity on the same end portion of the IC chip 2). In addition, the aforementioned leakage components are prevented from resonating within a waveguide tube (i.e., the dielectric board 11 surrounded by the upper and lower ground metal plates 12 and 13). Because of this, an unnecessary propagation mode is prevented from occurring and therefore unnecessary high-frequency signal components are prevented from propagating through the dielectric board 11 in directions (right-and-left direction in FIG. 7) crossing the strip lines 31, 32, and 33. Therefore, the degradation of isolation between the strip lines 31, 32, and 33 is considerably prevented.

Because of this, the interval between the through holes 50 is determined according to the wavelength of a high-frequency signal used. In general, a waveguide tube cannot propagate electromagnetic waves that have a wavelength greater than a wavelength twice the length of the long side of the waveguide tube (called a cut-off wavelength). Therefore, the interval between the through holes 50 is narrowed so that a cut-off wavelength is the wavelength of a high-frequency signal used. And the length of one side of a waveguide tube with through holes narrowed in this manner is shortened.

In the case where signals with frequencies (wavelengths) differing between the strip lines 31, 32, and 33 are transmitted, the intervals between the through holes 50 are set in consideration of the three different wavelengths. For instance, the intervals are set so that the minimum wavelength becomes a cut-off wavelength.

In addition, in this embodiment, to obtain a greater effect of preventing isolation degradation, as shown in FIGS. 1 to 3, the through holes 50 are arranged in two or three rows along the strip lines 30, 31, 32, and 33. They are also arranged closer to each other at the position where the IC chip 2 is mounted. However, if the through holes 50 are between the strip lines 31, 32, and 33 (particularly, adjacent portions) provided on the same end portion, the effect of preventing isolation degradation can be obtained to some degree.

As described above, the high-frequency restricting member is constructed of a plurality of through holes. Therefore, since it becomes possible to prevent the above-described line coupling and resonance phenomenon relatively easily by employing the existing through-hole processing technique, there is another advantage that the manufacturing cost can be reduced.

The present module is covered twice with different kinds of resins. That is, as shown in FIGS. 4 and 5, the connection portion between the mounting board 1 and the IC chip 2 is first covered with sealing resin 15. Then, the entire surface of the mounting board 1 is covered with molding resin 16. In this manner, the IC chip 2 is reinforced and fixed. In this case, the sealing resin 15 of the first kind covers the connection portion between the mounting board 1 and the IC chip 2, so the molding resin 16 of the second kind maybe poor in dielectric loss. In addition, if a radio-wave absorbing body is mixed with the molding resin 16 of the second kind, unnecessary radiation of radio waves from the bottom surface of the IC chip 2 can be prevented. Of course, the IC chip 2 may be covered with one kind of rein.

In the case where resin molding is performed later as described above, the mounting board 1 and the IC chip 2 are fixed integrally with each other and therefore the dielectric mounting board 11 may consist of a thin film.

Figure 8:
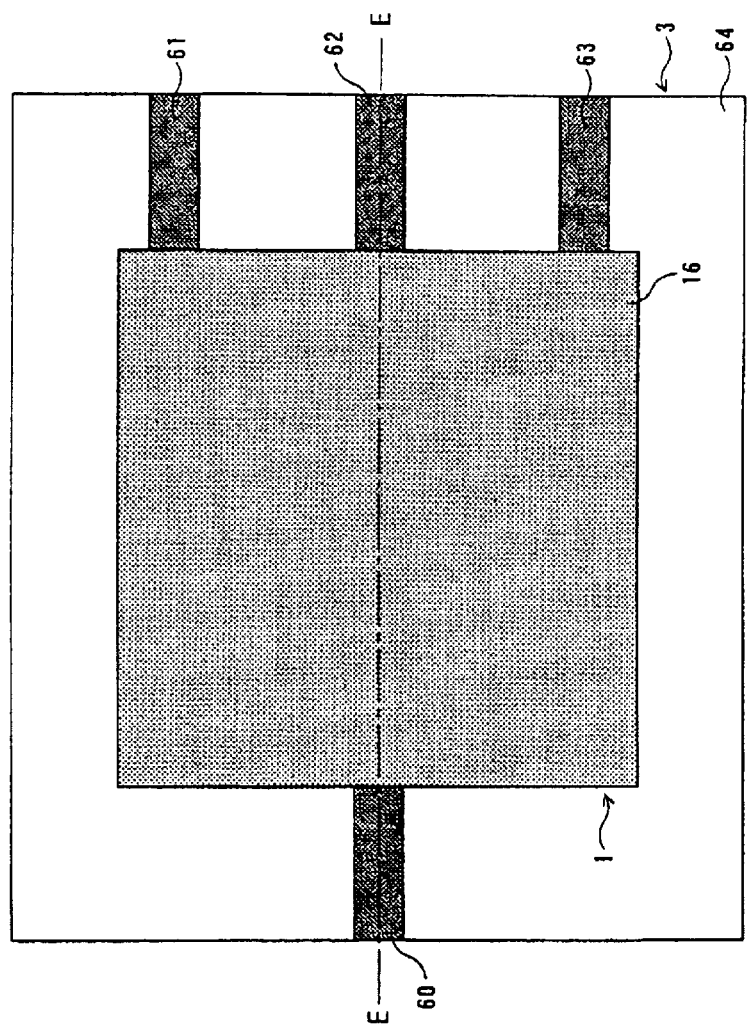
FIG. 8 is a plan view schematically showing the state in which the primary multilayer mounting board shown in FIGS. 1 to 7 is mounted on a secondary multilayer mounting board.
Figure 9:
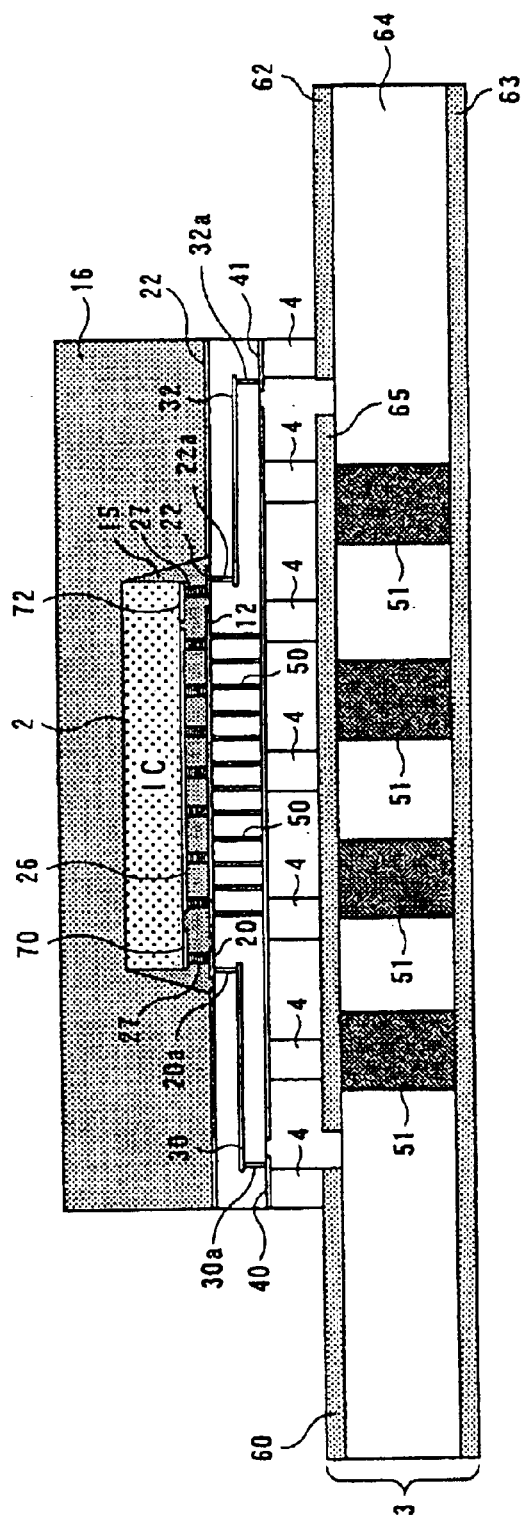
FIG. 9 is a sectional view taken along line E—E of FIG. 8.

In addition, the line width of the each external connection terminals (coplanar lines) 40, 41, 42, and 43 provided on the bottom surface of the mounting board 1 is made wider in consideration of secondary mounting. That is, as shown in FIGS. 8 and 9, the external connection terminals (coplanar lines) 40, 41, 42, and 43 provided on the bottom surface of the mounting board 1 are connected with signal lines 60, 61, 62, and 63 provided on the top surface of a secondary mounting board 3, through metal bumps 4. In this way, the mounting board 1 with the above-described structure can be mounted on the secondary mounting board 3 as a surface mounting module.

Because of this, the line width of each of the external connection terminals (coplanar lines) 40, 41, 42, and 43 is designed according to the line width of each of the signal lines 60, 61, 62, and 63 of the secondary mounting board 3. Even if the line width of the external connection terminals 40, 41, 42, and 43 (signal lines 60, 61, 62, and 63) is made wider, as described above, isolation degradation is prevented because the interval between the lines is wide. Note that resin containing radio-wave absorbing materials, for example, may be injected into the space between the mounting board 1 and the secondary mounting board 3 connected via metal bumps 4.

As shown in FIGS. 8 and 9, the secondary mounting board 3 has a dielectric board 64. The top surface (on which the mounting board 1 is mounted) is provided with signal lines 60, 61, 62, and 63 and a metal plate (ground metal plate) 65 which has an area corresponding to the area of the mounting board 1, while the bottom surface is provided with a metal plate (ground metal plate) 63. The metal plate 65 of the top surface is connected with the metal plate 63 of the bottom surface via a suitable number of through holes 51 provided within the dielectric board 64.

The provision of these through holes 51 can enhance the heat radiating effect through the metal bumps 4.

(A1) First Modification of the First Embodiment

Figure 10:
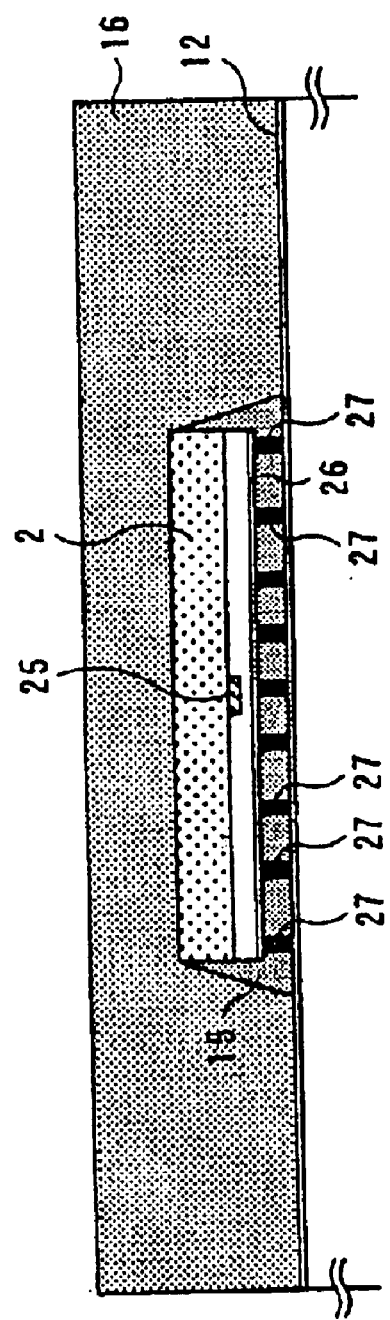
FIG. 10 is a sectional view of a high-frequency IC module constructed in accordance with a first modification of the first embodiment of the present invention.

In the IC chip 2, as shown in FIG. 10, a signal transmission line 25 which is employed in the interior of the IC chip 2 may consist of a signal line such as a reversed microstrip transmission line. The signal transmission line 25 may be shielded at the surface layer of the IC chip 2 by a ground metal plate 26. With this arrangement, signal-line exposed portions on the flip-chip mounting surface are only the coplanar lines 20, 21, 22, and 23, which are not long with respect to the wavelength of the connection portion between the mounting board 1 and the IC chip 2.

Therefore, even in the case where the IC chip 2 is fixed with resins 15 and 16, the portion which has a direct influence on signal transmission can be minimized and there is no possibility that a fluctuation in height of the metal bump 27 and the fixing resins 15 and 16 will have influence on high-frequency line characteristics. As a result, isolation between terminals can be assured even in a high-frequency band such as a microwave band, a milliwave band, etc. At the same time, there is realized a surface mounting module of a resin molding type where the IC chip 2 is flip-chip mounted.

(A2) Second Modification of the First Embodiment

Figure 11:
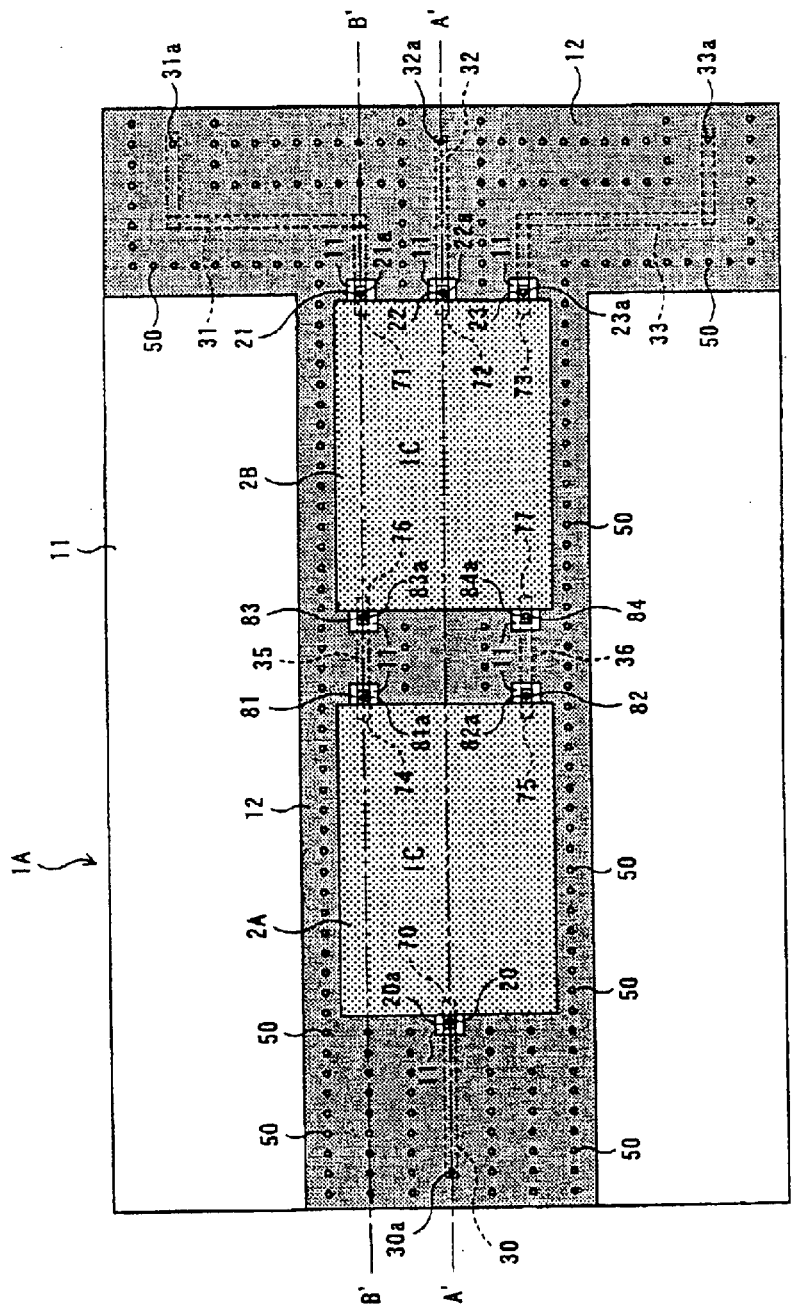
FIG. 11 is a plan view schematically showing a high-frequency IC module constructed in accordance with a second modification of the first embodiment of the present invention, two IC chips being mounted on one primary multilayer mounting board.
Figure 12:
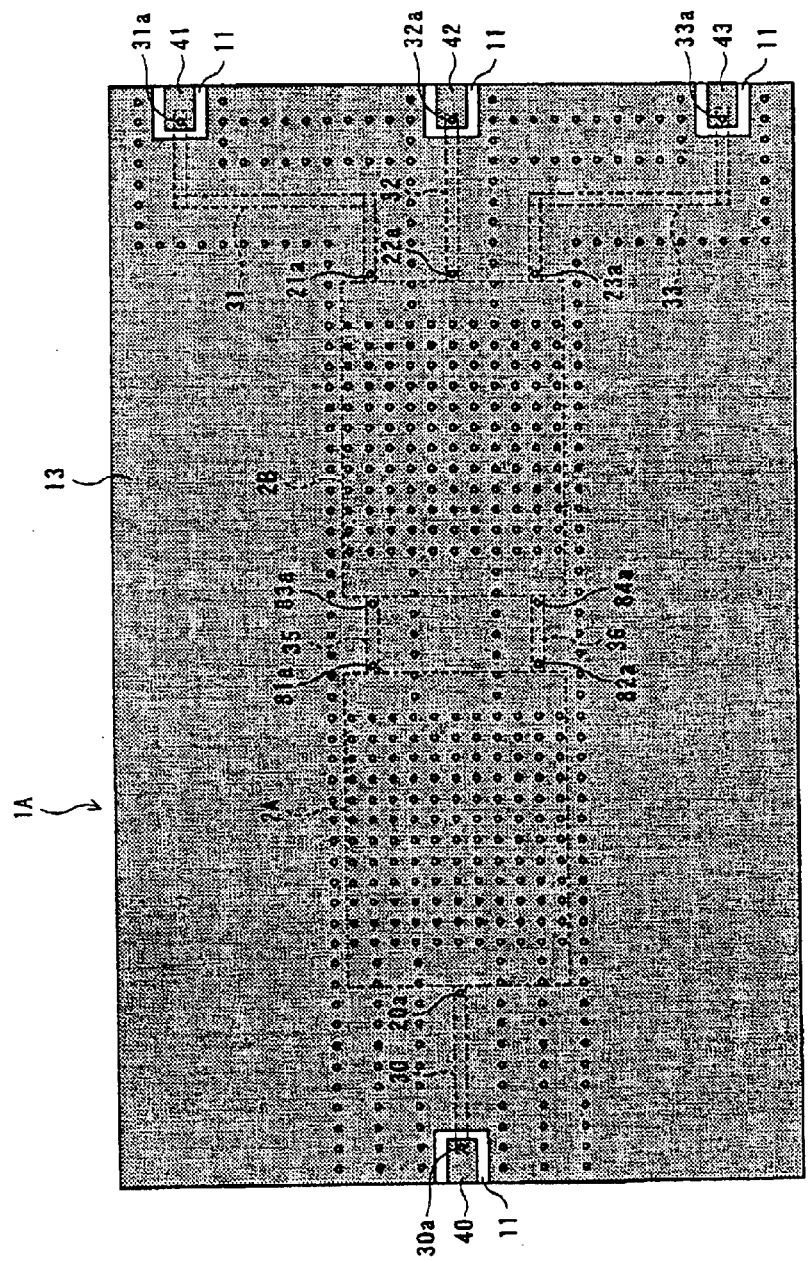
FIG. 12 is a plan view schematically showing the bottom surface of the primary multilayer mounting board shown in FIG. 11.
Figure 13:
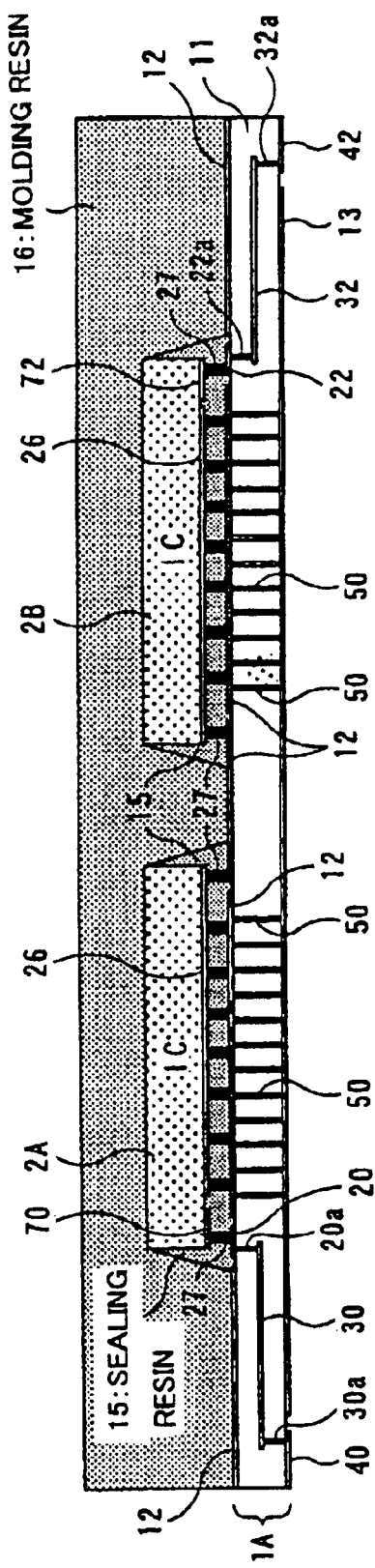
FIG. 13 is a sectional view taken along line A'—A' of FIG. 11.
Figure 14:
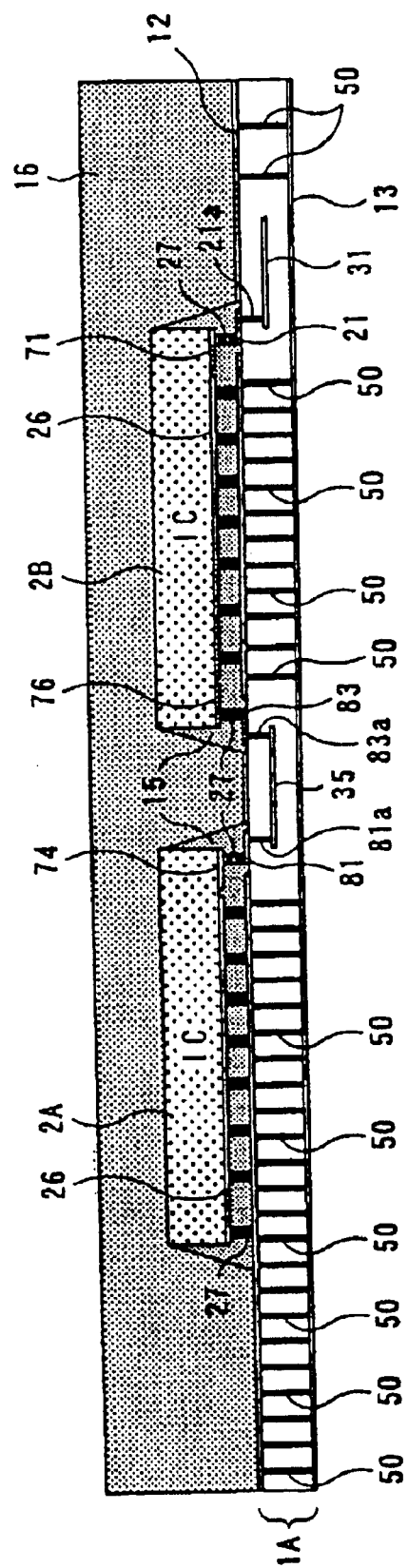
FIG. 14 is a sectional view taken along line B'—B' of FIG. 11.

FIG. 11 shows a plan view of a high-frequency IC module in which a first IC chip 2A (1×2 terminals) and a second IC chip 2B (2×3 terminals) are mounted on one primary multilayer mounting board 1A. FIG. 12 shows a plan view of the bottom surface of the primary multilayer mounting board 1A shown in FIG. 11. FIG. 13 shows a sectional view taken along line A'—A' of FIG. 11, and FIG. 14 a sectional view taken along line B'—B' of FIG. 11. In FIG. 11, sealing resin 15 and molding resin 16 are omitted.

As shown in FIGS. 11 to 14, the primary multilayer mounting board 1A in this modification has a dielectric board 11. The top surface of the dielectric board 11 is provided with coplanar lines 20, 81, 82 which constitute connection portions with the RF signal terminals 70, 74, and 75 of the first IC chip 2A; coplanar lines 83, 84, 82, 21, 22, and 23 which constitute connection portions with the RF signal terminals 76, 77, 71, and 73 of the second IC chip 2A; and an upper metal plate or ground metal plate (shaded portion) 12 partially covering the dielectric board 11 while avoiding the coplanar lines 20, 81, and 82 and coplanar lines 83, 84, 21, 22, and 23. The bottom surface of the dielectric board 11 is provided with external connection terminals (coplanar lines) 40, 41, 42, and 43 which are the same as those shown in FIG. 3; and a lower metal plate (ground metal plate) 13 covering the entire surface of the dielectric board 11 while avoiding these external connection terminals 40, 41, 42, and 43.

Within the dielectric board 11, there are provided strip lines 30, 31, 32, and 33. As in the embodiment of FIG. 4, one end of the strip line 30 is connected with the coplanar line 20 via a through hole 20a. The coplanar line 20 is connected with the RF signal terminal 70 of the first IC chip 2A through the metal bump 27. The other end of the strip line 30 is connected with the external connection terminal 40 of the bottom surface via a through hole 30a.

Similarly, the microstrip transmission lines 31, 32, and 33 are connected at their inner ends with the coplanar lines 21, 22, and 23 which are connected with the RF signal terminals 71, 72, and 73 of the second IC chip 2B through metal bumps 27, via through holes 21a, 22a, and 23a. The strip lines 31, 32, and 33 are also connected at their outer ends with the external connection terminal 41, 42, and 43 of the bottom surface via through holes 31a, 32a, and 33a.

As with the first embodiment, as shown in FIGS. 11 and 12, through holes 50 for connecting the upper and lower ground metal plates 12 and 13 together are provided to surround the strip lines 30, 31, 32, and 33 in order to prevent isolation degradation.

At positions corresponding to the IC chips 2A and 2B, a strip line 35 is provided to connect the RF signal terminal 74 (coplanar line 81) of the first IC chip 2A with the RF signal terminal 76 (coplanar line 83) of the second IC chip 2B. Likewise, a strip line 36 is provided so as to connect the RF signal terminal 75 (coplanar line 82) of the first IC chip 2A with the RF signal terminal 77 (coplanar line 84) of the second IC chip 2B. One end of the strip line 35 is connected with the coplanar 81 of the first IC chip 2A via a through hole 81a, while the other end is connected with the coplanar 83 of the second IC chip 2B via a through hole 83a. One end of the strip line 36 is connected with the coplanar 82 of the first IC chip 2A via a through hole 82a, while the other end is connected with the coplanar 84 of the second IC chip 2B via a through hole 84a.

In this manner, the IC chips 2A and 2B are interconnected via the microstrip transmission lines 35, 36 within the dielectric board 11. As in the first embodiment, as shown in FIGS. 11 and 12, through holes 50 for connecting the upper and lower ground metal plates 12, 13 together are provided to surround these strip lines 35, 36.

Therefore, even in the case where a plurality of IC chips 2A and 2B require a plurality of signal connection lines (strip lines 35, 36), necessary isolation can be assured, as with the first embodiment. In addition, the signal line portion that is exposed to the mounting surfaces of the IC chips 2A and 2B is the same as the case of the first embodiment in which one IC chip 2 is mounted. Furthermore, the connection signal lines for the IC chips 2A and 2B are provided within the dielectric board 11 as the strip lines 35, 36. Therefore, there is no influence due to resin molding.

In each of the IC chips 2A and 2B, as with the first modification, an interior signal line may consist of a reversed microstrip transmission line, which may be shielded at the surface layer of the IC chip by a ground metal plate. In the case where 3 or more IC chips are mounted on one primary multilayer mounting plate, the required isolation can be assured in the above-described manner.

(B) Second Embodiment

Figure 15:
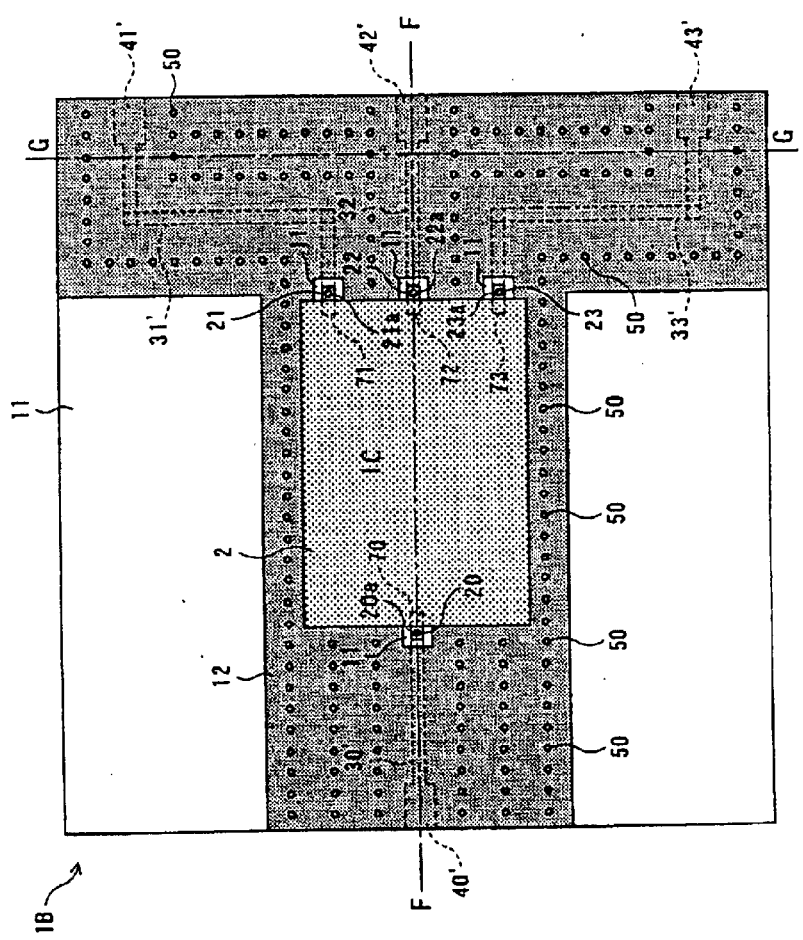
FIG. 15 is a plan view schematically showing a high-frequency IC module constructed in accordance with a second embodiment of the present invention.
Figure 16:
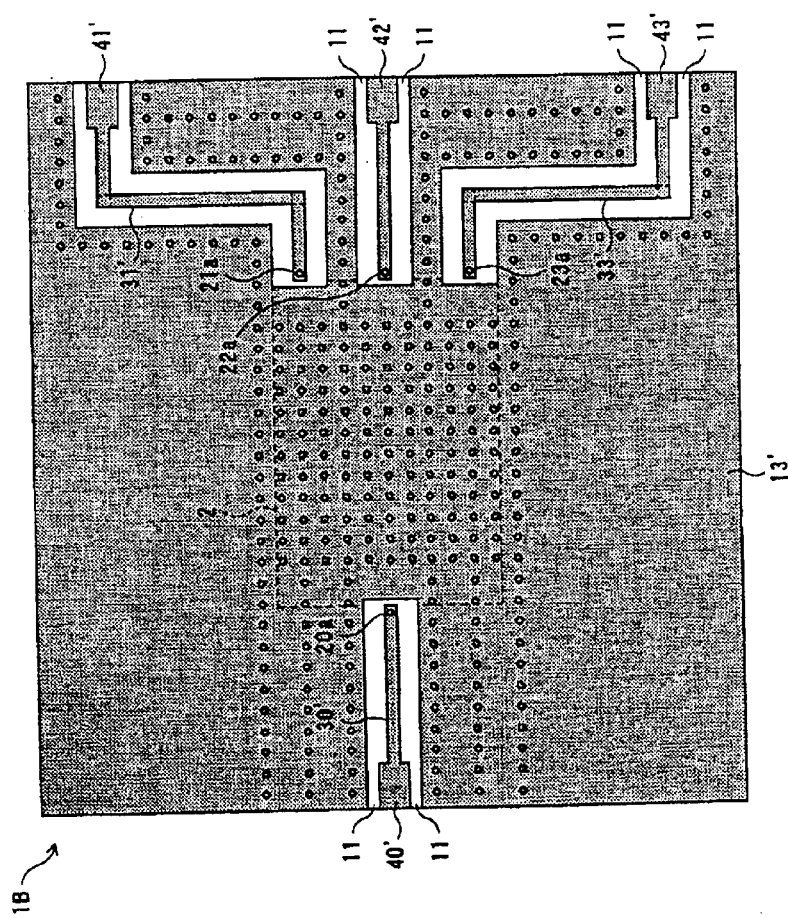
FIG. 16 is a plan view schematically showing the bottom surface of the primary multilayer mounting board shown in FIG. 15.
Figure 17:
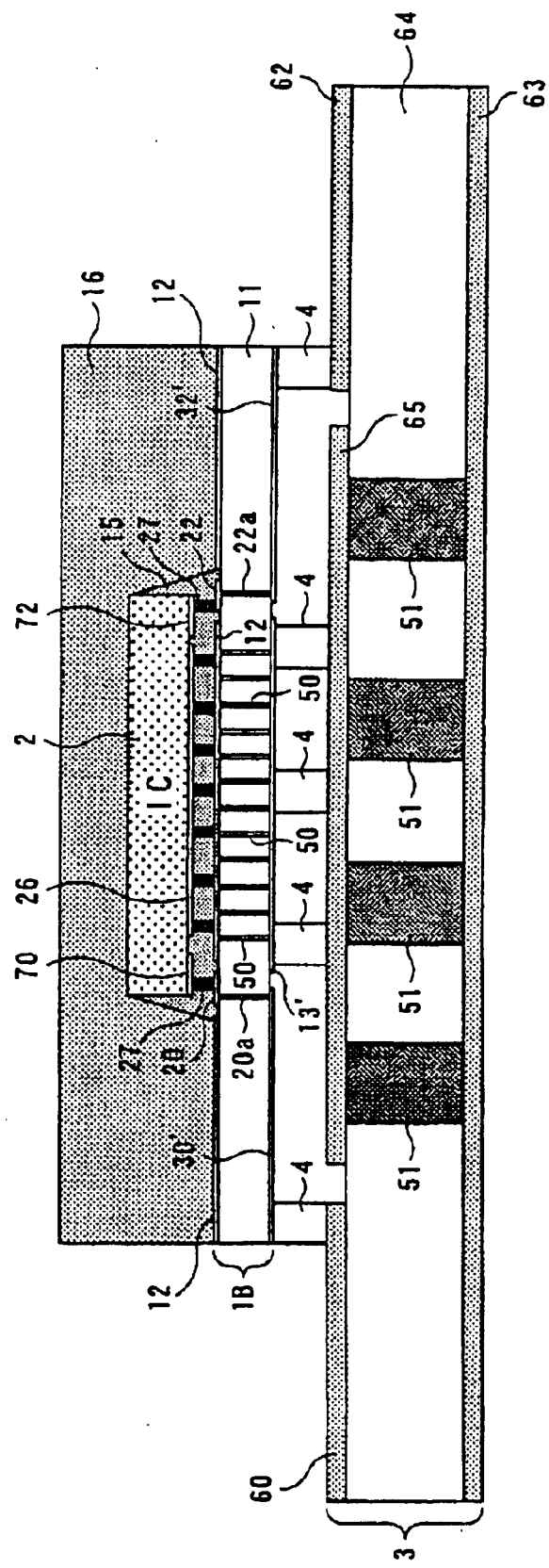
FIG. 17 is a sectional view taken along line F—F of FIG. 15 when secondary mounting is mounted.

FIG. 15 is a plan view schematically showing a high-frequency IC module constructed in accordance with a second embodiment of the present invention. In the figure, reference numeral 1B denotes a primary multilayer mounting board (also referred to simply as a "mounting board"), and reference numeral 2 denotes an IC chip mounted on the mounting board 1B. FIG. 16 is a plan view showing the bottom surface of the mounting board 1B shown in FIG. 15. FIG. 17 shows a sectional view taken along line F—F of FIG. 15 when secondary mounting is performed, and FIG. 18 a sectional view taken along line G—G of FIG. 15 when secondary mounting is performed.

Note that a plan view of the high-frequency IC module with a secondary mounting board mounted thereon is the same as that shown in FIG. 8. In FIGS. 15 to 18, parts with the same reference numerals as the above-described reference numerals are the same as the above-described parts or correspond to the above-described parts, unless otherwise noted. In FIG. 15, sealing resin 15 and molding resin 16 are omitted.

Figure 18:
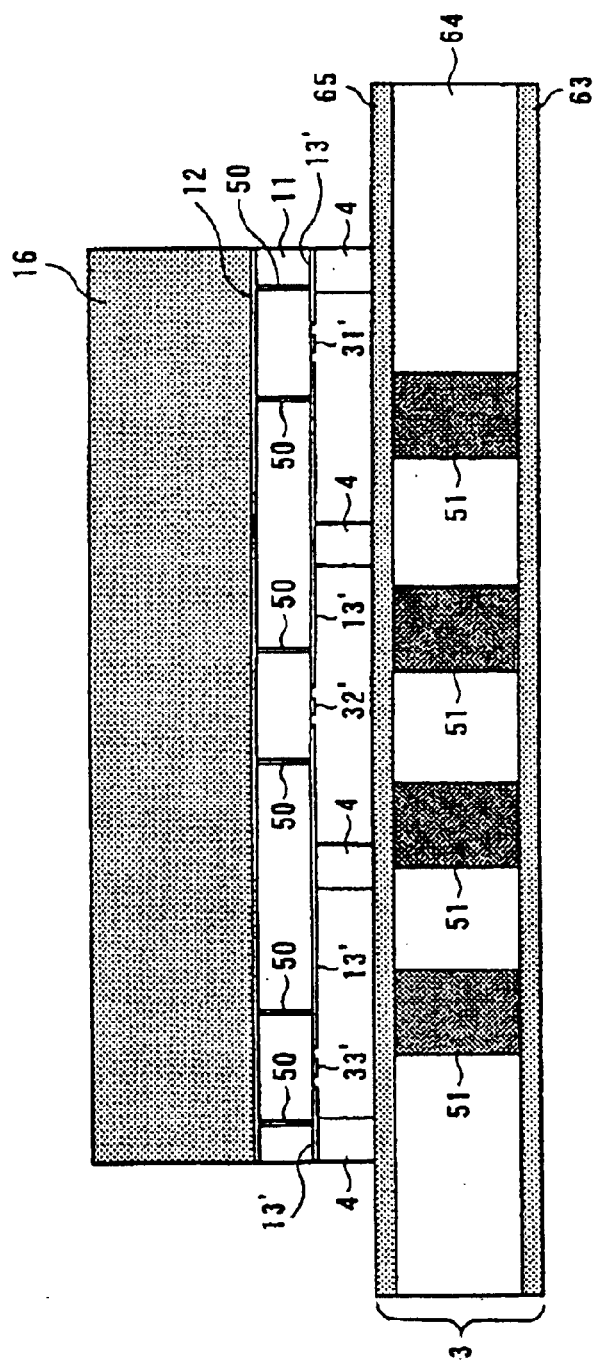
FIG. 18 is a sectional view taken along line G—G of FIG. 15 when secondary mounting is mounted.
Figure 19:
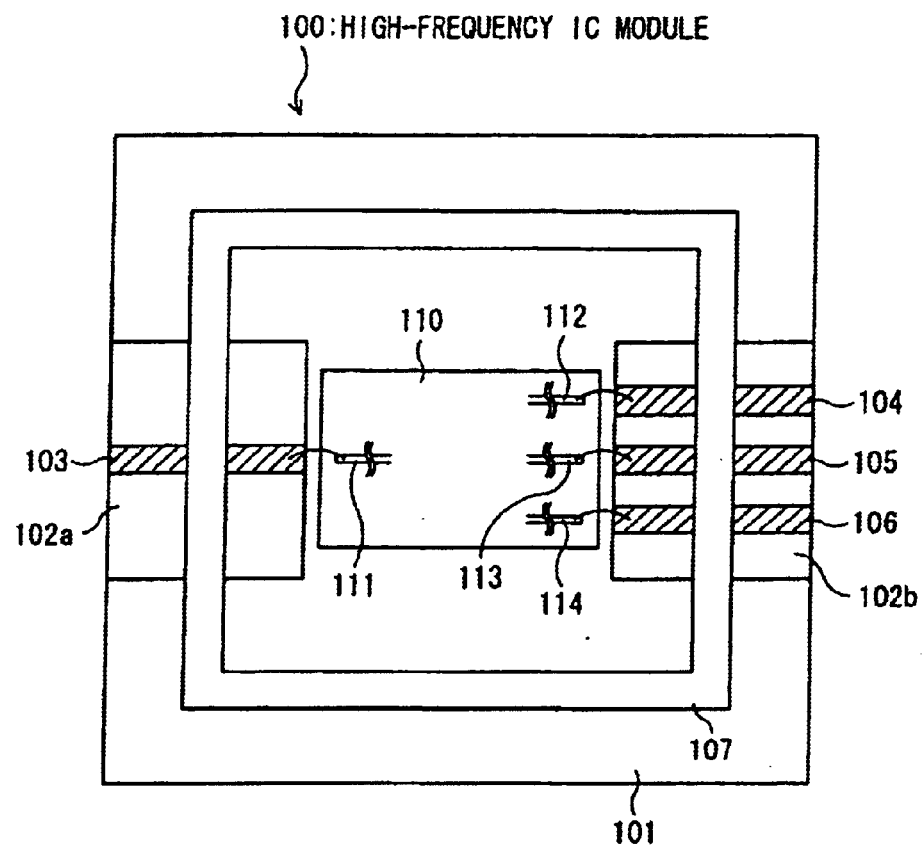
FIG. 19 is a plan view schematically showing a prior art high-frequency IC module.
Figure 20:
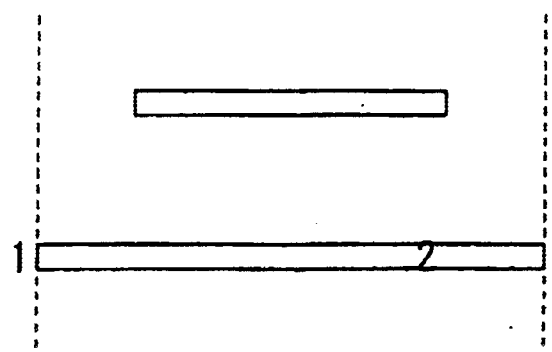
FIG. 20 is a diagram showing a layout in the case where an electro-magnetic simulation of microstrip transmission lines close to each other is made.
Figure 21A:
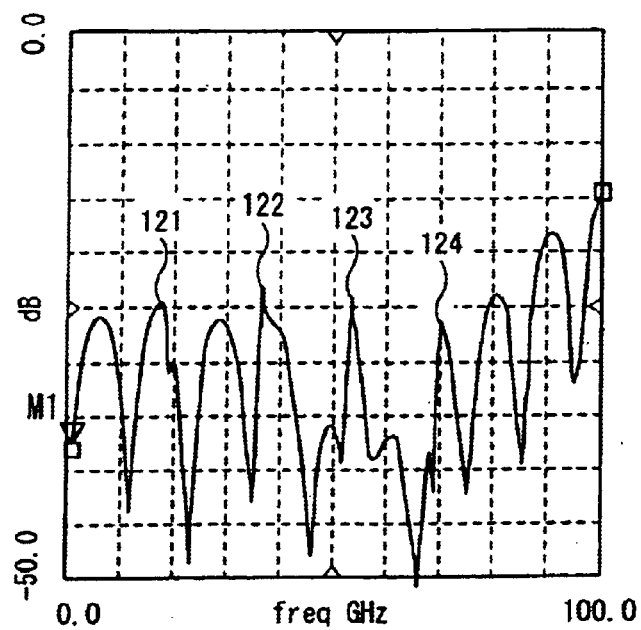
FIG. 21A is a graph showing an example of a transmission characteristic (reflection characteristic) obtained by the simulation (in which microstrip transmission lines of 0.2 mm in thickness are arranged at the interval of 1 mm) shown in FIG. 20.
Figure 21B:
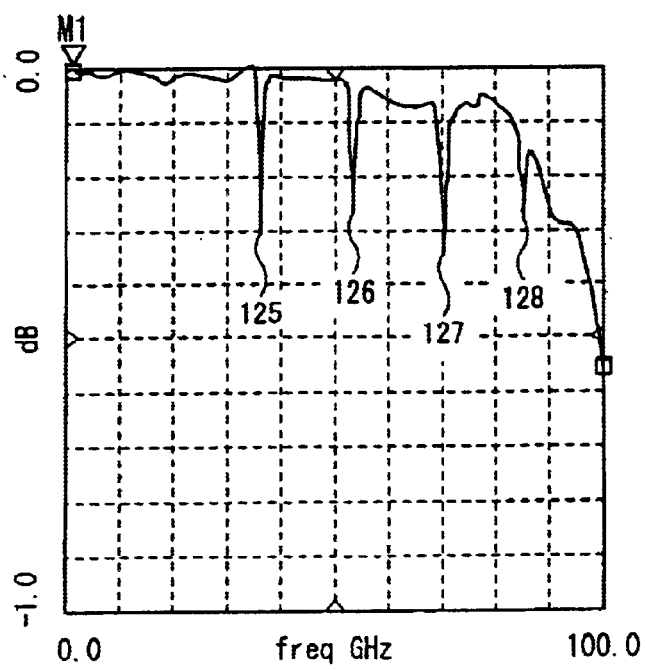
FIG. 21B is a graph showing an example of a transmission characteristic (through characteristic) obtained by the simulation (in which microstrip transmission lines of 0.2 mm in thickness are arranged at the interval of 1 mm) shown in FIG. 20.
Figure 22A:
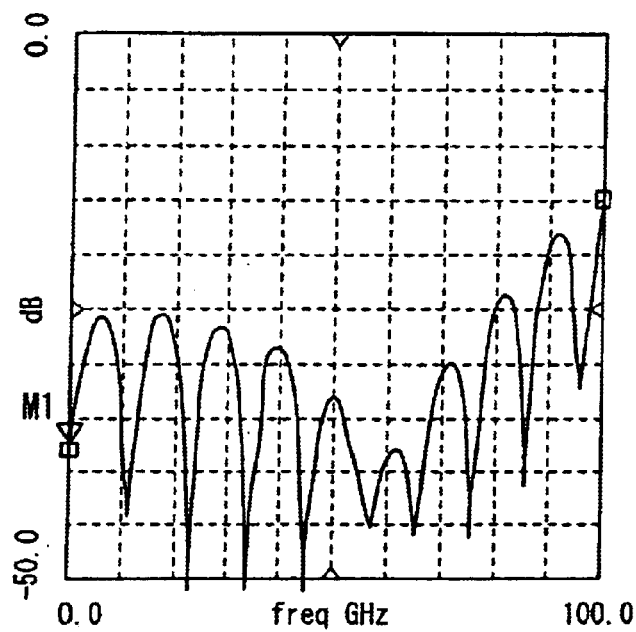
FIG. 22A is a graph showing an example of a transmission characteristic (reflection characteristic) obtained by the simulation (in which the line interval is 1.5 mm) shown in FIG. 20.
Figure 22B:
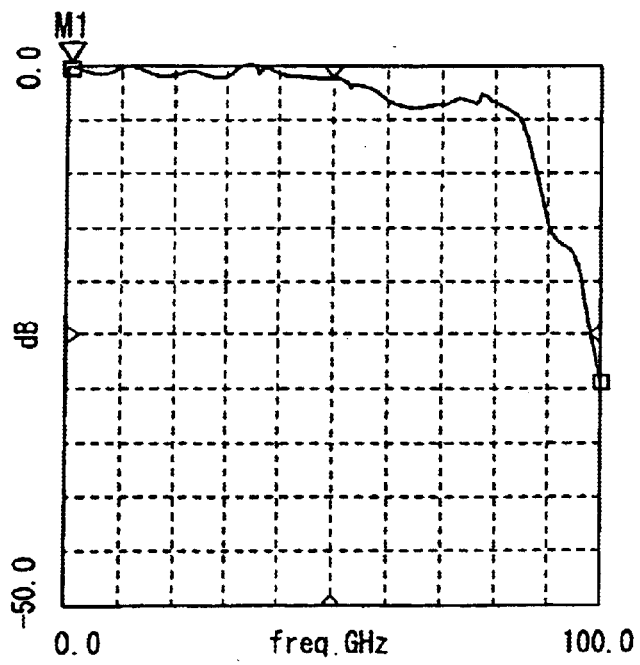
FIG. 22B is a graph showing an example of a transmission characteristic (through characteristic) obtained by the simulation (in which the line interval is 1.5 mm) shown in FIG. 20.
Figure 23A:
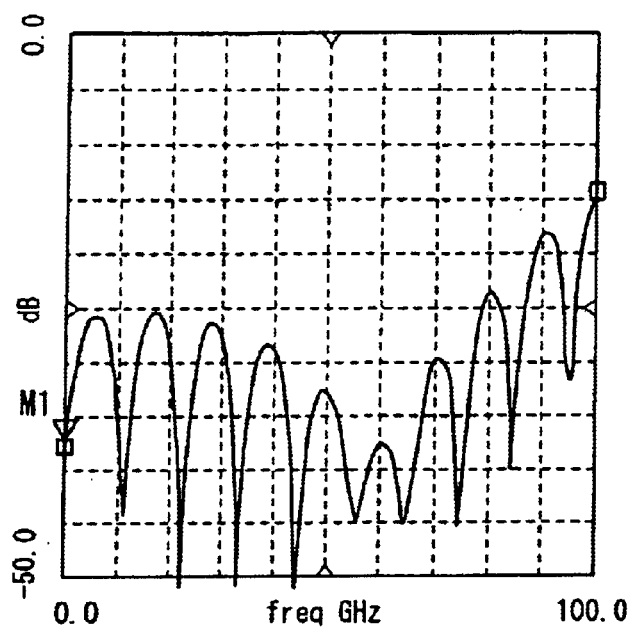
FIG. 23A is a graph showing an example of a transmission characteristic (reflection characteristic) obtained by the simulation (in which the line interval is 3.0 mm) shown in FIG. 20.
Figure 23B:
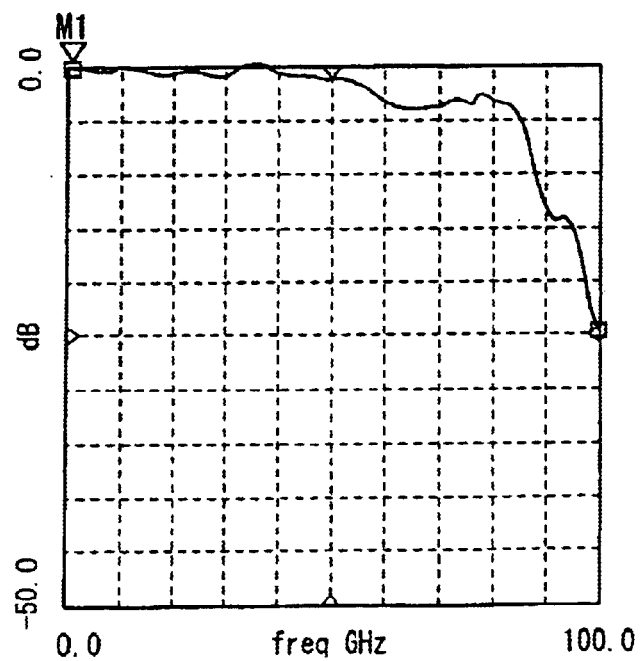
FIG. 23B is a graph showing t an example of a transmission characteristic (through characteristic) obtained by the simulation (in which the line interval is 3.0 mm) shown in FIG. 20.

In the second embodiment, as shown in FIGS. 16 and 18, microstrip lines 30', 31', 32', and 33' are provided as a metal pattern on the bottom surface of a dielectric board 11 constituting the mounting board 1B by vapor deposition or plating. One end of each of the microstrip lines 30', 31', 32', and 33' is formed as an external connection terminal (40', 41', 42', or 43'). The width of each external connection terminal (40', 41', 42', and 43') is greater than that of the signal line. That is, the external connection terminals 40', 41', 42', and 43' in the second embodiment are formed integrally with the microstrip lines 30', 31', 32', and 33' and are also used as high-frequency signal lines.

As with the first embodiment, to assure isolation between lines, the microstrip lines 31' and 33' on the same end portion of the mounting board 1B are disposed in crank form so that the interval therebetween becomes wider as they go away from the IC chip 2 (in the right-and-left direction of FIG. 16). Therefore, since the intervals between signal lines 61, 62, and 63 on a secondary mounting board 3 can be made sufficiently wider, isolation at the secondary mounting board 3 can also be assured. As in the first embodiment, the microstrip lines 31 and 33 may also be disposed in straight-line form or curved-line form.

As shown in FIGS. 15 to 17, the inner ends of the microstrip lines 30', 31', 32', and 33' are connected with coplanar lines 20, 21, 22, and 23 via through holes 20a, 21a, 22a, and 23a. The coplanar lines 20, 21, 22, and 23 are connected with the RF signal terminals 70, 71, 72, and 73 of the IC chip 2 through metal bumps 27.

As shown in FIGS. 15 and 16, in addition to the above-described through holes 20a, 21a, 22a, and 23a connected with the microstrip lines 30', 31', 32', and 33', the mounting board 1B in the second embodiment is similarly provided with a plurality of through holes 50 through which the upper ground metal plate 12 is connected with the lower ground metal plate 13'.

These through holes 50, as shown in FIGS. 15 and 16, are basically provided along the microstrip lines 30', 31', 32', and 33' so that they surround the microstrip lines 30', 31', 32', and 33'. This arrangement can prevent a bad influence within the mounting board 1B due to unnecessary leakage components of a high-frequency signal (in a microwave band or milliwave band) propagating through the microstrip lines 30', 31', 32', and 33'.

When secondary mounting is performed, the module with the above-described structure is connected to the secondary mounting board 3 through metal bumps, as shown in FIGS. 17 and 18. When they are connected together, at least the above-described external connection terminals 40', 41', 42', and 43' are connected with the signal lines 60, 61, 62, and 63 on the secondary mounting board 3 (see FIG. 8) through metal bumps 4.

As a result, the RF signal terminals 70, 71, 72, and 73 of the IC chip 2 are connected with the signal lines 60, 61, 62, and 63 of the secondary mounting board 3 through the microstrip lines 30', 31', 32', and 33' (external connection terminals 40', 41', 42', and 43') disposed on the bottom surface of the mounting board 1B.

In accordance with the second embodiment of the present invention, as described above, the RF signal terminals 71, 72, and 73 (coplanar lines 21, 22, and 23) on the same end portion of the IC chip 2 are connected with the microstrip lines 31', 32', and 33' (disposed on the bottom surface of the mounting board 1b so that the intervals between microstrip lines 31', 32', and 33' become wider as they go away from the IC chip 2) via through holes 21a, 22a, and 23a. In addition, a plurality of through holes 50 are provided along the microstrip lines 31', 32', and 33' so as to surround the microstrip lines 31', 32', and 33'. Therefore, even in the case where signals in a microwave band or milliwave band are handled, isolation can be reliably assured between the external connection terminals 41', 42', and 43' and accordingly between the signal lines 61, 62, and 63 of the secondary mounting board 3.

As evident in FIGS. 9 and 17, the microstrip lines 30', 31', 32', and 33' of the second embodiment (disposed as a metal pattern on the bottom surface of the mounting board 1B) can be easily manufactured, compared with the case of FIG. 9 in which the strip lines 30, 31, 32, and 33 are provided within the mounting board 1B (dielectric board 11).

In this case, the microstrip lines 30', 31', 32', and 33' are disposed on the bottom surface of the mounting board 1B. However, when the mounting board 1B is mounted on the top surface of the secondary mounting board 3, the microstrip lines 30', 31', 32', and 33' are situated within a space closed by the ground metal plate 13' of the mounting board 1B and the ground metal plate 65 of the secondary mounting board 3. Therefore, there is no line isolation degradation.

In the case where the microstrip lines 30+, 31', 32', and 33' are provided on the bottom surface of the primary multilayer mounting board 1B as a metal pattern, as in the second embodiment, the outer ends of the microstrip lines 30', 31', 32', and 33' are formed as the external connection terminals 40', 41', 42', and 43'. Therefore, compared with the case where the microstrip transmission lines are formed separately from the external connection terminals, the second embodiment is capable of enhancing signal transmission reliability and reducing the number of manufacturing steps and the manufacturing cost.

(C) Others

While the present invention has been described with reference to the preferred embodiments thereof, the invention is not to be limited to the details given herein, but may be modified within the scope of the invention hereinafter claimed. For example, in the above-described embodiments, while the high-frequency restricting member is constructed by the arrangement of through holes 50, it may be constructed by disposing metal wall members which connect the upper and lower ground metal plates 12 and 13 (or 13') intermittently or continuously along the arrangement of through holes 50. In this case, it is possible to obtain a greater effect of preventing isolation degradation.

The upper ground metal plate 12, which is provided on the surface (IC-chip mounting surface) of the dielectric board 11, may be disposed on the entire surface (excluding a connection portion with the IC chip) of the dielectric board 11. The lower ground metal plate 13 (or 13'), which is provided on the bottom surface of the dielectric board 11, may be disposed on a portion of the bottom surface, the same as the disposition of the upper ground metal plate 12. Furthermore, the upper ground metal plate 12 and lower ground metal plate 13 (or 13') may also be provided on portions in which through holes 50 are arranged.

The number of RF signal terminals of the IC chips 2, 2A, and 2B are not limited to the above-described embodiments. As long as an IC chip has a plurality of RF signal terminal on the same end portion, it can be applied in the same way as the above-described embodiments and the same advantages can be obtained.

What is claimed is:

1. A high-frequency integrated circuit (IC) module comprising:
   a multilayer mounting board on which an IC with a plurality of high-frequency signal terminals on one side portion thereof is mounted;
   a plurality of IC connecting portions disposed on one surface of said multilayer mounting board on which said IC is mounted, said IC connecting portions being respectively connected with said plurality of high-frequency signal terminals of said IC;
   a plurality of external connection terminal portions disposed on a side portion of the other surface of said multilayer mounting board which portion corresponds to said one side portion of said IC, at wider intervals than those between the high-frequency signal terminals of said IC;
   a plurality of high-frequency signal lines provided within said multilayer mounting board to transmit high-frequency signals;
   a plurality of first through holes for respectively connecting the inner ends of said high-frequency signal lines with said IC connecting portions;
   a plurality of second through holes for respectively connecting the outer ends of said high-frequency signal lines with said external connection terminal portions; and
   a high-frequency restricting member for respectively ground-connecting the both surfaces of said multilayer mounting board and restricting propagation of high-frequency signals, provided at least between said high-frequency signal lines and along said high-frequency signal lines.

2. The high-frequency IC module as set forth in claim 1, wherein said high-frequency restricting member comprises a plurality of third through holes for ground-connecting the both surfaces of said multilayer mounting board, said plurality of third through holes being provided within said multilayer mounting board and at least between said high-frequency signal lines and along said high-frequency signal lines.

3. The high-frequency IC module as set forth in claim 1, wherein said IC connecting portions comprise coplanar lines, respectively.

4. The high-frequency IC module as set forth in claim 1, wherein said external connection terminal portions comprise coplanar lines, respectively.

5. The high-frequency IC module as set forth in claim 2, wherein said IC connecting portions comprise coplanar lines, respectively.

6. The high-frequency IC module as set forth in claim 2, wherein said external connection terminal portions comprise coplanar lines, respectively.

7. The high-frequency IC module as set forth in claim 3, wherein said external connection terminal portions comprise coplanar lines, respectively.

8. The high-frequency IC module as set forth in claim 5, wherein said external connection terminal portions comprise coplanar lines, respectively.

9. A high-frequency integrated circuit (IC) module comprising:
   a primary multilayer mounting board on which an IC with a plurality of high-frequency signal terminals on one side portion thereof is mounted;
   a plurality of IC connecting portions disposed on one surface of said primary multilayer mounting board on which said IC is mounted, said IC connecting portions being respectively connected with said plurality of high-frequency signal terminals of said IC;
   a plurality of external connection terminal portions disposed on a side portion of the other surface of said primary multilayer mounting board which portion corresponds to said one side portion of said integrated circuit, at wider intervals than those between the high-frequency signal terminals of said IC;

a plurality of high-frequency signal lines provided on the other surface of said primary multilayer mounting board and respectively connected at their outer ends with said external connection terminal portions;

a plurality of first through holes for respectively connecting the inner ends of said high-frequency signal lines with said IC connecting portions;

a secondary multilayer mounting board connected with the other surface of said primary multilayer mounting board through bumps; and a high-frequency restricting member for ground-connecting positions between said high-frequency signal lines with the one surface of said primary multilayer mounting board and restricting propagation of high-frequency signals, provided at least along said high-frequency signal lines.

10. The high-frequency IC module as set forth in claim 9, wherein said high-frequency restricting member comprises a plurality of second through holes for ground-connecting both surfaces of said primary multilayer mounting board, said plurality of second through holes being provided within said primary multilayer mounting board.

11. The high-frequency IC module as set forth in claim 9, wherein said IC connecting portions comprise coplanar lines, respectively.

12. The high-frequency IC module as set forth in claim 9, wherein the outer ends of said high-frequency signal lines are formed as said external IC connecting terminal portions, respectively.

13. The high-frequency IC module as set forth in claim 10, wherein said IC connecting portions comprise coplanar lines, respectively.

14. The high-frequency IC module as set forth in claim 10, wherein the outer ends of said high-frequency signal lines are formed as said external IC connecting terminal portions, respectively.

15. The high-frequency IC module as set forth in claim 11, wherein the outer ends of said high-frequency signal lines are formed as said external IC connecting terminal portions, respectively.

16. The high-frequency IC module as set forth in claim 13, wherein the outer ends of said high-frequency signal lines are formed as said external IC connecting terminal portions, respectively.

* * * * *